United States Patent
Mithal et al.

(10) Patent No.: US 6,983,542 B2
(45) Date of Patent: Jan. 10, 2006

(54) METALLIZED CUTLERY AND TABLEWARE

(75) Inventors: Ashish K. Mithal, North Chelmsford, MA (US); David Gordon, Groton, MA (US); Raymond Chan, Framingham, MA (US); Thomas E. Ellsworth, Wilmington, MA (US); William A. Gallop, Westminster, MA (US)

(73) Assignee: Waddington North America, Inc., Chelmsford, MA (US)

( * ) Notice: Subject to any disclaimer, the term of this patent is extended or adjusted under 35 U.S.C. 154(b) by 195 days.

(21) Appl. No.: 10/228,147

(22) Filed: Aug. 26, 2002

(65) Prior Publication Data
US 2003/0037443 A1 Feb. 27, 2003

Related U.S. Application Data
(60) Provisional application No. 60/314,677, filed on Aug. 24, 2001.

(51) Int. Cl.
*A47J 43/28* (2006.01)

(52) U.S. Cl. ............................. 30/322; 30/324; 30/340
(58) Field of Classification Search ................... 30/322, 30/324, 340, 526; D7/653
See application file for complete search history.

(56) References Cited

U.S. PATENT DOCUMENTS

| | | |
|---|---|---|
| 1,197,256 A | 9/1916 | Brearley |
| 3,136,416 A | 6/1964 | Goldrosen |
| 3,445,350 A | 5/1969 | Klinger et al. |
| 3,607,350 A | 9/1971 | Rathsack |
| 3,629,922 A | 12/1971 | Miller |
| 3,896,252 A | 7/1975 | Tuttle |
| 3,962,494 A | 6/1976 | Nuzzi |
| 4,009,995 A * | 3/1977 | Dressler .................... 8/516 |
| 4,039,714 A | 8/1977 | Roubal et al. |
| 4,073,743 A | 2/1978 | Midler, Jr. et al. |
| 4,195,117 A | 3/1980 | Luch |
| 4,461,895 A | 7/1984 | Fritschi et al. |
| 4,632,253 A | 12/1986 | Stromgren et al. |
| 4,803,094 A | 2/1989 | Myers |
| 4,810,333 A | 3/1989 | Gulla et al. |
| 4,825,025 A | 4/1989 | Seiferth |
| 5,022,554 A | 6/1991 | Heeter et al. |
| 5,177,124 A | 1/1993 | Questel et al. |
| 5,280,052 A | 1/1994 | Questel et al. |
| 5,782,346 A | 7/1998 | Gray et al. |
| 6,145,204 A | 11/2000 | Cash |
| 2003/0031891 A1 * | 2/2003 | Fields ........................ 428/626 |

FOREIGN PATENT DOCUMENTS

JP  57005870  1/1982

OTHER PUBLICATIONS

Hilestad, K., Decorating and Printing, Modern Plastics Encylopedia 1999 F–7.
PCT International Search Report dated Dec. 19, 2002 of International Application No. PCT/US02/24232 filed Aug. 26, 2002.
European Search Report dated Aug. 17, 2004 of European Patent Application No. EP 02 76 3539.0 filed Aug. 26, 2002.

* cited by examiner

Primary Examiner—Douglas D Watts
(74) Attorney, Agent, or Firm—Maine & Asmus

(57) ABSTRACT

A plastic cutlery item, fabricated primarily from a plastic material, such as polystyrene, having a metallic coating that imparts to this cutlery item the appearance of metal cutlery or silverware. The plastic cutlery or tableware items are molded using traditional injection molding techniques, and subjected to a vacuum metallizing process in an individualized non-contiguous manner, where a thin metallic layer is deposited on at least one of their surfaces. The resultant items simulate the appearance of solid metal cutlery or tableware. In the most preferred embodiment of the invention the plastic cutlery or tableware items are molded from a light-transmitting grade of Polystyrene resin and are coated with a thin stainless steel layer through vacuum sputtering deposition on only one of the surfaces.

37 Claims, 7 Drawing Sheets

METALLIZED CUTLERY AND TABLEWARE

CROSS-REFERENCE TO RELATED APPLICATIONS

This application claims priority under 35 U.S.C. 119(e) from a U.S. Provisional Patent Application Ser. No. 60/314,677, filed Aug. 24, 2001, which is incorporated herein by reference for all purposes.

FIELD OF THE INVENTION

This invention relates generally to the production of food-service articles for household, catering and restaurant use including commercial and institutional tableware. More particularly, this invention relates to plastic cutlery having a metallic appearance.

BACKGROUND OF THE INVENTION

Disposable plastic food-service items are in increasingly widespread use for storing, serving and consuming food, due to their reasonably low-cost and the convenience they provide. Disposable food containers and articles range from non-returnable containers such as yogurt cups and dinner entree packaging, to microwavable storage containers and general tableware items such as plastic plates, cups and cutlery. The increasing popularity of fast-food restaurant chains further fuels the demand for plastic tableware. In addition to the fast food restaurants, caterers also prefer disposable food service items for the associated convenience, hygiene and competitive-costs. In this regard it is important to note that replacement costs for disposable items such as cutlery are offset by the clean-up costs (labor, materials and equipment) associated with metal cutlery.

The presence of non-disposable metal cutlery along with other disposable food-service articles such as plates, cups and the like presents unusual problems for restaurants and caterers. The problems stem from the loss of valuable metal cutlery into trash or refuse containers along with disposable tableware and food remnants. The problem can be further accentuated during peak business hours where time-pressures can further cause leftover food on a plate together with one or more items of cutlery to be scrapped. Previous attempts to circumvent this problem are known. U.S. Pat. No. 4,632,253 describes apparatus for separating cutlery from restaurant waste, including a chute for the waste and an inductive type probe with associated evaluation logic for sending an electric switching signal when an item of cutlery passes along the chute.

Another problem that food caterers encounter is the ability to clean metal flatware utensils at certain locations and outdoor catering events. In preparation for such circumstances caterers tend to carry a large inventory of expensive metal cutlery. The use of disposable plastic cutlery for such catering events would eliminate the limitations with cleaning metal flatware, handling heavy metal cutlery or keeping a large inventory thereof. In addition, it is noteworthy that disposable cutlery offers significant handling advantages compared to its metal-counterparts. For example, a typical cutlery combination containing a fork, a knife, a tablespoon, and a teaspoon would weigh about 200 grams for metal flatware versus about 30 grams for premium plastic cutlery. Applying these weights to a hypothetical 250-person event would yield an overall weight for metal cutlery of about 110 lbs., as compared to only 16 lbs. for plastic cutlery.

Due to the history of terrorist attacks in airplanes and the potential threat resulting from misuse of stainless steel flatware as weapons, there has been an increased tendency for major airline organizations to utilize disposable plastic cutlery while serving meals during flights. However, the use of disposable plastic cutlery affects the image of the airline, especially in premium seating and higher priced flights.

A significant number of upscale catering establishments utilize disposable plastic cups, plates, and bowls etc. for catering functions. However, there is a general preference for continued use of traditional metal cutlery. The primary reason is the less-than-classic appearance, perception and image of plastic cutlery compared to stainless steel flatware. Although stainless steel cutlery is stronger than plastic cutlery, heavy weight plastic cutlery is functionally adequate for most occasions. Thus, a primary obstacle for use of disposable cutlery in such catering events is perception and the image associated with disposable cutlery rather than its performance.

From the foregoing, it can be readily appreciated, that there is a need for cutlery implements that offer the disposability of plastic cutlery and the upscale perception of real stainless steel flatware. Thus, imparting a metallic appearance to disposable plastic cutlery would enhance the perceived value and quality of the cutlery items. A metallic appearance would also lead to greater acceptance of disposable cutlery, as worthy replacements for metal flatware, for use at various events and occasions by caterers and other food-service establishments.

The same is true for the additional tableware items such as cups and plates, although to a lesser extent. Employing a metallic appearance such as gold or silver to the plates and cups to coordinate with the cutlery enhances the aesthetics and provides a more regal presence. The state of the art generally does not introduce metallized cups and plates due to the difficulties discussed herein. Thus while the present description focuses on cutlery, the information is also relevant to other tableware items.

Various methods of imparting a metallic look have been utilized in the prior art. One of the most common and inexpensive methods of imparting a metallic look to plastic parts is the incorporation of a metallic pigment, in the plastic resin, during the molding process. The metallic pigments, typically, have a high metal-content loading. Metallic pigment additives and colorants are manufactured and sold by a variety of pigment and master-batch colorant manufacturers such as Clariant, Engelhard and EM Industries. Other methods commonly employed for enhancing the visual impact of a plastic part and enhancing its commercial appeal consist of applying a finish or graphic to some portion or the entire article. A variety of methods for decorating plastic articles, including printing, hot stamping, heat transfers, in-mold decorating, spray painting, and electroplating are known. Printing techniques have been further classified as silk screen printing, gravure or offset printing, and pad transfer printing (see Hilestad, K., Decorating and Printing, Modern Plastics Encyclopedia 1999, F-7).

It has been the experience of the inventors of the present invention and those skilled in the art that traditional decorating and plastic pigmenting techniques do not impart a commercially acceptable metallic look to plastic cutlery due to a variety of reasons.

First, it is the general experience of those skilled in the art that these metallic pigments do provide a level of sheen to the plastic surface, but do not approach the polished metal look of fine cutlery. In addition, some of the formulations for metallic pigments have an odor which is less-than-desirable for a food-service item.

Second, metallic inks do not approach the genuine look of polished stainless steel flatware.

Third, environmental and food contact issues associated with cutlery further limit the use of metallic inks and carrier solvents that can be used for imparting a metallic look.

Fourth, fine stainless steel flatware is often characterized by an intricate design particularly on the handle of the cutlery items. Consistent with the objective of this invention, namely, to render fine plastic cutlery that is practically indistinguishable from fine metal cutlery requires that design trends be in general agreement with traditional flatware for commercial acceptance. This poses a particular problem with in-mold labeling, wherein a label is strategically placed inside the mold, prior to molding, and hot plastic is introduced into the mold to affect label adhesion on the molded part. The fine and intricate design provided on the surface of the plastic cutlery interferes with label adhesion and results in wrinkling of the label in the areas containing the fine design details.

Fifth, hot stamping, particularly metal foil stamping can provide an authentic metallic-look when strategically placed on a plastic surface. However, hot foil stamping poses the same challenges previously described with in-mold labeling, where foil wrinkling and inconsistent adhesion in the intricate detail areas limit the utility of the foil stamping process for obtaining metallic-look cutlery.

Sixth, electroplating methods are undesirable due to the environmental impact associated with electroplating chemicals as is known in the art.

Various metallizing methods are known, including U.S. Pat. No. 5,022,554 that describes metallized tableware, such as plates, cups, etc., made of a paper substrate, a metallized plastic film joined to the substrate, and an FDA approved top coating over the plastic film. This method of obtaining a metallic-look food service items by laminating a metallized film is not readily applicable to cutlery due to the fact that most plastic cutlery is generally produced by the injection-molding process wherein the feedstock is thermoplastic resin pellets and not laminated film. The shortcomings of incorporating a metallic foil or label during injection molding plastic cutlery have been discussed herein above. Similar shortcomings would apply to the use of a laminated metallic film.

Other approaches to metallization such as those used by Quest et al. (U.S. Pat. Nos. 5,177,124 and 5,280,052) describe a utilitarian and/or decorative object and a method for forming plastic parts having a metallic outer face, appearance and hand. In this technique, a mixture of a liquid monomer, curing agent, a dispersion of metal particles and floatable particles are poured into a mold. The mold is then centrifuged to cause the metal particles to migrate towards the surface of the piece before the monomer polymerizes and hardens to bind the particles. After removal from the mold, the outer face of the piece is polished and buffed to remove the plastic skin from the metal surface, whereby the resultant plastic piece simulates the appearance of a solid metal piece. This method is too cumbersome for application to plastic cutlery as most plastic cutlery is either made of polystyrene and/or polypropylene which are thermoplastic polymeric materials and not monomeric as the above prior art teaching suggests. In addition, the typical process for producing cutlery is injection molding and it is difficult and cost-prohibitive, if not impossible, to rotate a heavy injection mold. And, finally the secondary step of cleaning and buffing the plastic piece is expensive and unacceptable for food-service use.

Various references are available on plating of plastic materials by chemical deposition techniques, electro-deposition techniques and/or a combination thereof. Some plating methods are described in U.S. Pat. Nos. 3,607,350; 3,629,922; 3,896,252; 3,962,494; 4,4,610,895; 3,445,350; 4,039,714; 4,073,743; 4,195,117; 4,810,333 and numerous others. These techniques are essentially wet processes and require that parts be brought into contact with solutions containing metal ions, which must then be washed off to remove any residual chemicals and for general hygiene reasons for a food service article. These processes are relatively unattractive for metallizing cutlery because of the high process and environmental costs.

Thus, it can be readily established that there is a need for fine plastic cutlery that has an enhanced visual and commercial appeal. The improved plastic cutlery should be inexpensive, permitting simple disposal and not requiring separation from food refuse. Such an invention should be manufactured without environmental shortcomings generally associated with metal-plating wet processes. An improved plastic cutlery article should be fabricated primarily from plastic materials, yet have the appearance of genuine metal on the outer surface such that it is practically visually indistinguishable from fine metal cutlery.

SUMMARY OF THE INVENTION

The present invention is devised in the light of the problems of the prior art described herein. Accordingly it is a general object of the present invention to provide cutlery items that can solve the problems described herein. One of the objects of the invention is to provide premium disposable cutlery item(s) fabricated mainly from plastic materials and having a metallic surface appearance that simulates genuine metal flatware.

Yet another object of the present invention is to provide a method, which lends itself to mass production of plastic cutlery having an authentic metallic appearance at a reasonable cost for disposable use.

Still another object of the present invention is to provide a method for metallization of injection-molded plastic cutlery at a reasonable incremental cost.

A further object of the present invention is to provide disposable cutlery that has the appearance of fine metal cutlery.

A further object of the present invention is to obtain a plastic object, such as a cutlery item, which is molded from a light transmitting thermoplastic material and is subsequently metallized.

Still another object of the present invention is to provide a plastic article such as a cutlery item, molded from a light transmitting thermoplastic material, which is metallized on one side only.

A further object of the present invention is to provide cutlery items having a surface geometry, which enhances the reflective appearance of the metallized plastic cutlery. Surface geometry of the cutlery items prepared according this invention is characterized by a plurality of surface features including concave and convex areas, ribs, flutes and other artistic features that enhance the reflective appearance of the article.

Still another object of the present invention is to provide metallized plastic cutlery items wherein the metal layer has enhanced adhesion and abrasion resistance. For example, applying an over coating to the thin metallic layer further enhances the abrasion resistance characteristics of the metallic layer. FDA approved versions of over coating compositions can be readily obtained from a variety of vendors.

In addition, another object of the present invention is to provide metallized cutlery items having enhanced optical density by incorporating a color tint, such as a gray tint, in the base material.

An object of the invention is a metallized plastic food service item, comprising a plastic tableware article with a thin metallic coating deposited on the plastic tableware item, wherein the thin metallic coating is deposited by a vacuum deposition process. The tableware items include cutlery such as forks, spoons, knives, as well as other tableware items such as plates, bowls, and cups.

Yet a further object is the metallized plastic food service item, wherein the thin metallic coating is comprised of a metal selected from the group consisting of silver, steel, stainless steel, chromium, aluminum, copper and gold. The thin metallic coating is generally less than 1000 nm. In addition, the article can further comprise a thin overcoat of a curable clear coating on the thin metallic coating. In addition, the plastic tableware article can have the metallic coating disposed on a single surface of the plastic tableware article.

An additional object is the metallized plastic food service item, wherein the plastic tableware article is composed of polystyrene and is produced by injection molding. The article can also be composed of a similar light transmitting plastic material. And, wherein the metallized plastic food service item has an optical density of less than 2.0.

An object of the invention is a metallized plastic food service article produced by the process comprising the steps of forming a plastic tableware body by injection molding, placing the plastic body into a vacuum metallizing unit, and depositing on the plastic body a thin metallic coating by a vacuum deposition process. In one embodiment the vacuum deposition process is physical vapor deposition, and in particular sputtering vapor deposition, with the sputtering deposition process utilizing plasma generated by mixtures of Argon and Nitrogen.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various respects, all without departing from the spirit of the invention.

DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENT

Figure 1A:
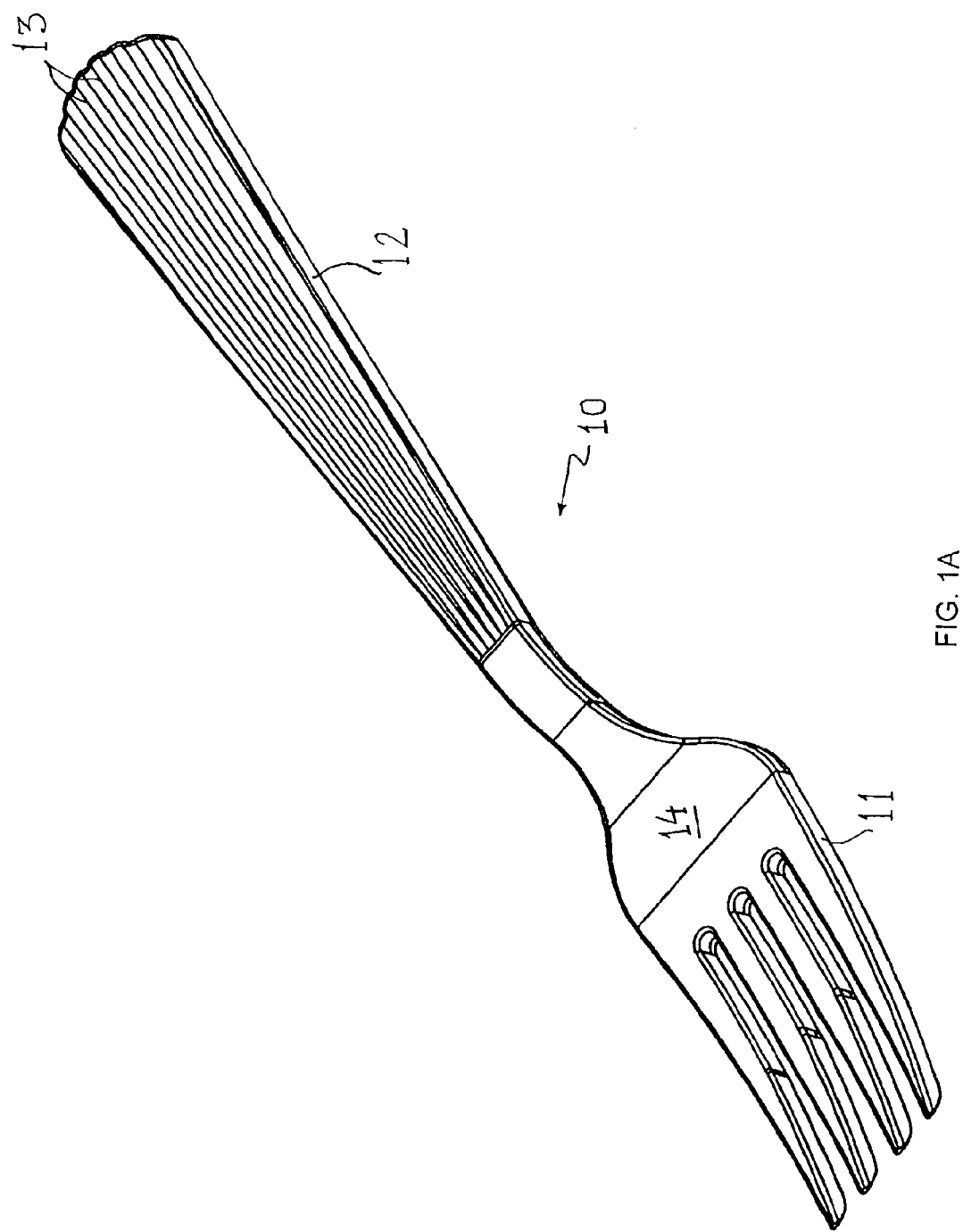
FIG. 1A shows an isometric view of a fork with metallic coating that has been constructed in accordance with the invention.

The terms cutlery or cutlery items or utensils or eating implements or food-implements or food-handling implements or food service tools as used in this description or in any of the appended claims are used in a generic and broad sense. These terms encompass disposable plastic cutlery items molded into standard food-handling implements such as forks, spoons, knives, serving utensils and/or combinations thereof including spatulas, sporks, ladles, seafood forks, seafood picks, soup spoons, and the like. Accompanying items such as napkin rings, candle holders, and centerpiece receptacles are sometimes designed to match the cutlery items. Finally, the various assortments of goblets, glasses, soup bowls, dishes, trays, champagne flutes, lids, and the like are also sometimes matched to the rest of the serving items and are all within the scope of the present invention. The preferred embodiments are merely illustrations of the techniques, and there are many other variations and applications all within the scope of the invention.

Disposable cutlery items, which are currently sold in the marketplace, are typically constructed of either polystyrene and/or polypropylene. However, it would be clear to those skilled in the art that a variety of thermoplastic polymer types and/or resin grades can be employed for the purpose of making the cutlery items of the present invention. Material choices for such applications are more often than not governed by a variety of factors including consumer preferences, cost, engineering requirements, availability and other economic and market factors. The primary selection criteria for the present invention for a base material are: High-end attractive appearance of the cutlery item; Superior optical properties with respect to light transmission characteristics; High rigidity; and High surface energy or adhesion characteristics for metallization.

Several thermoplastic resins having desired optical and functional characteristics including polystyrene (PS), polymethyl methacrylate (PMMA), acrylonitrile-butadiene-styrene (ABS), styrene-acrylonitrile (SAN) and polycarbonate (PC) can be employed for achieving the objects of this invention. Polystyrene (PS) was the material of choice for the preferred embodiment of the invention on several accounts. Polystyrene resin has a lower cost compared to ABS, PC and SAN. It is the general experience of those skilled in the art that polystyrene cutlery is perceived as the higher end disposable cutlery in the marketplace. One criterion for selecting crystal polystyrene as the material of choice for this application is the relatively high flexural modulus of polystyrene compared to other resin materials in an equivalent price range. More specifically, the flexural modulus of polystyrene is superior to that of polypropylene. Crystal polystyrene has excellent light transmission characteristics due to its amorphous polymeric structure as opposed to polypropylene, which is highly crystalline in nature. In addition, variable cooling rates such as are encountered in the injection molding process have little effect on the light transmission characteristics of the molded article due to the amorphous polymeric structure of polystyrene. In other words, crystal polystyrene has a large processing window with respect to its optical characteristics.

And, Polystyrene exhibits a higher surface energy compared to polypropylene and other polyolefins and is a better substrate for adhesion to other materials.

Thus, in the most preferred embodiment of the present invention, the cutlery items are molded from a suitable crystal polystyrene resin grade having good physical properties and desirable flow, melt viscosity and molding characteristics from a production and manufacturing standpoint.

Referring now to FIGS. 1A, 1B, 2A, 2B, 3A and 3B there are shown typical cutlery items, which have been constructed in accordance with the present invention wherein like parts are designated by like reference numerals.

FIG. 1A shows an isometric perspective view of a fork represented by reference numeral 10 having its general construction in accordance with the present invention. Fork 10 has a tines portion 11 and a handle portion 12. Fork 10 also contains surface features in the form of flutes or other geometrical artistic contours generally denoted by reference numeral 13. A surface-coating layer of metal is deposited on at least one of the surfaces of the plastic fork to impart the appearance of a metallic cutlery piece. In the most preferred embodiment of the invention the metallic coating is applied to the side that is facing-up in a typical place setting for a food-event. The metallic coating on the plastic surface of the fork is denoted by reference numeral 14.

Figure 1B:
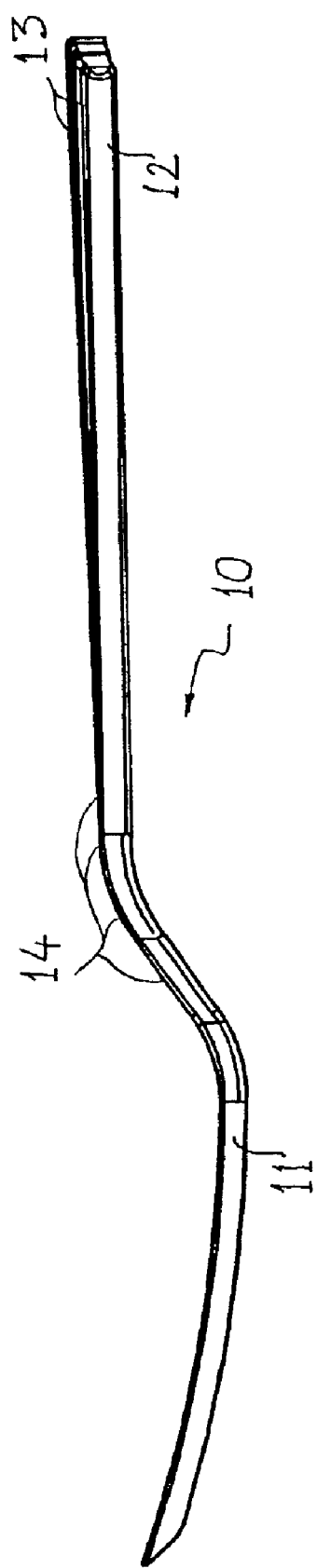
FIG. 1B is a side profile view of a fork with metallic coating in accordance with the invention.

FIG. 1B shows a side view of Fork 10 wherein the various fork portions are identified with the corresponding reference numeral designations of FIG. 1A. The metallic coating is imparted on only the upper surface of the plastic fork and is represented by reference numeral 14.

Figure 2A:
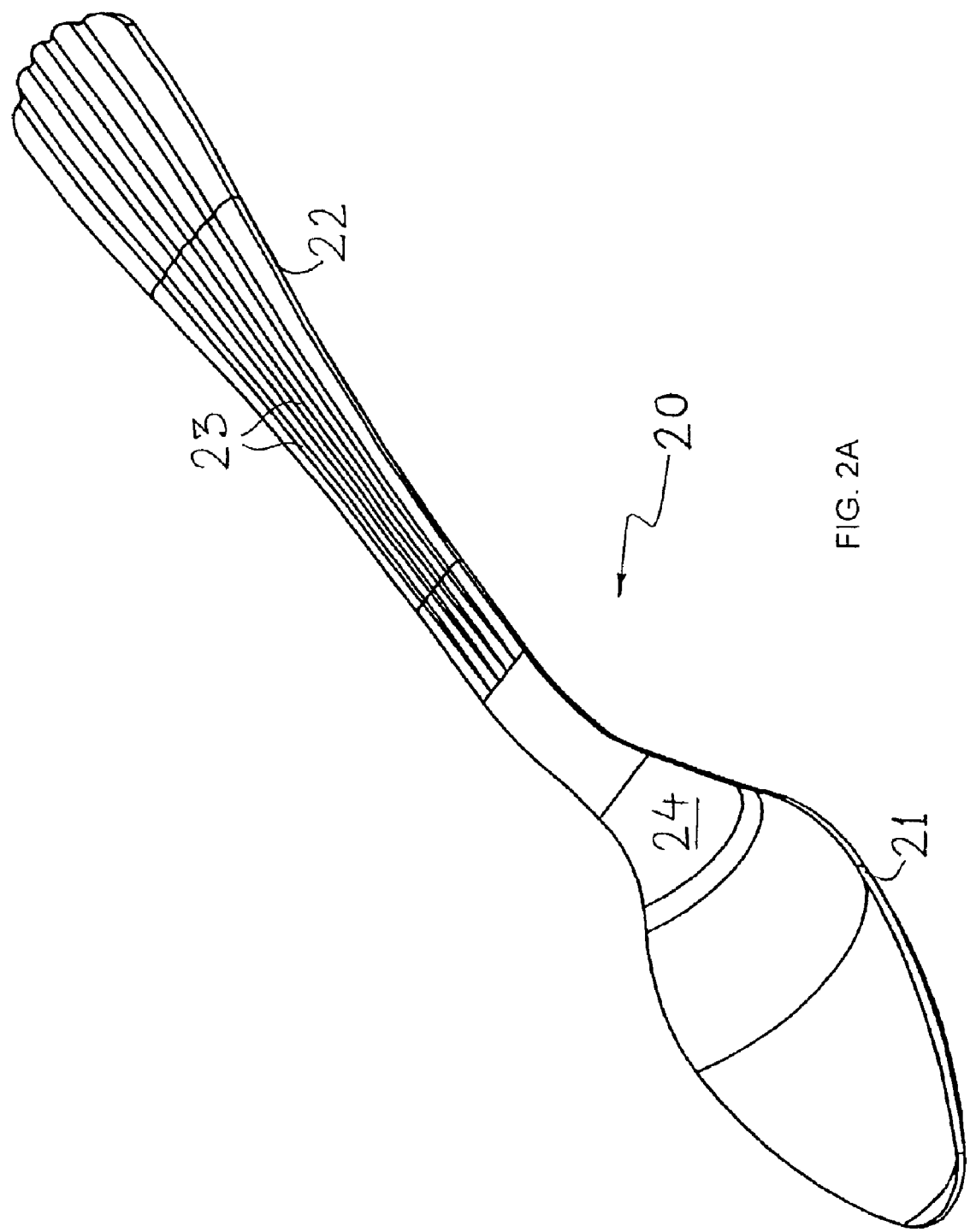
FIG. 2A is an isometric view of a spoon with metallic coating in accordance with the invention.
Figure 2B:
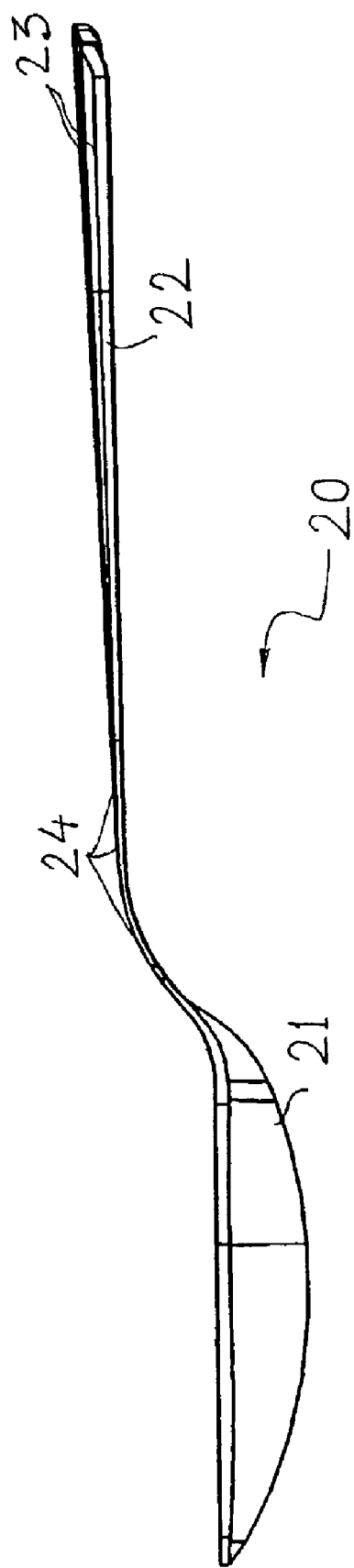
FIG. 2B is a side profile view of a spoon with metallic coating in accordance with the invention.

Referring now to FIG. 2A, there is shown an isometric perspective view of a spoon represented by reference numeral 20 having its general construction in accordance with the present invention. Similarly, FIG. 2B shows a side view of spoon 20 wherein like reference numerals represent like parts or features. Spoon 20 has a bowl portion 21 and a handle portion 22. Spoon 20 also contains surface features in the form of flutes or other geometrical artistic contours generally denoted by reference numeral 23. A surface-coating layer of metal is deposited on at least one of the surfaces of the plastic spoon to impart the appearance of a metallic cutlery piece. In the most preferred embodiment of the invention the metallic coating is applied to the side that is facing-up in a typical place setting for a food-event. The metallic coating on the plastic surface of the spoon is denoted by reference numeral 24.

Figure 3A:
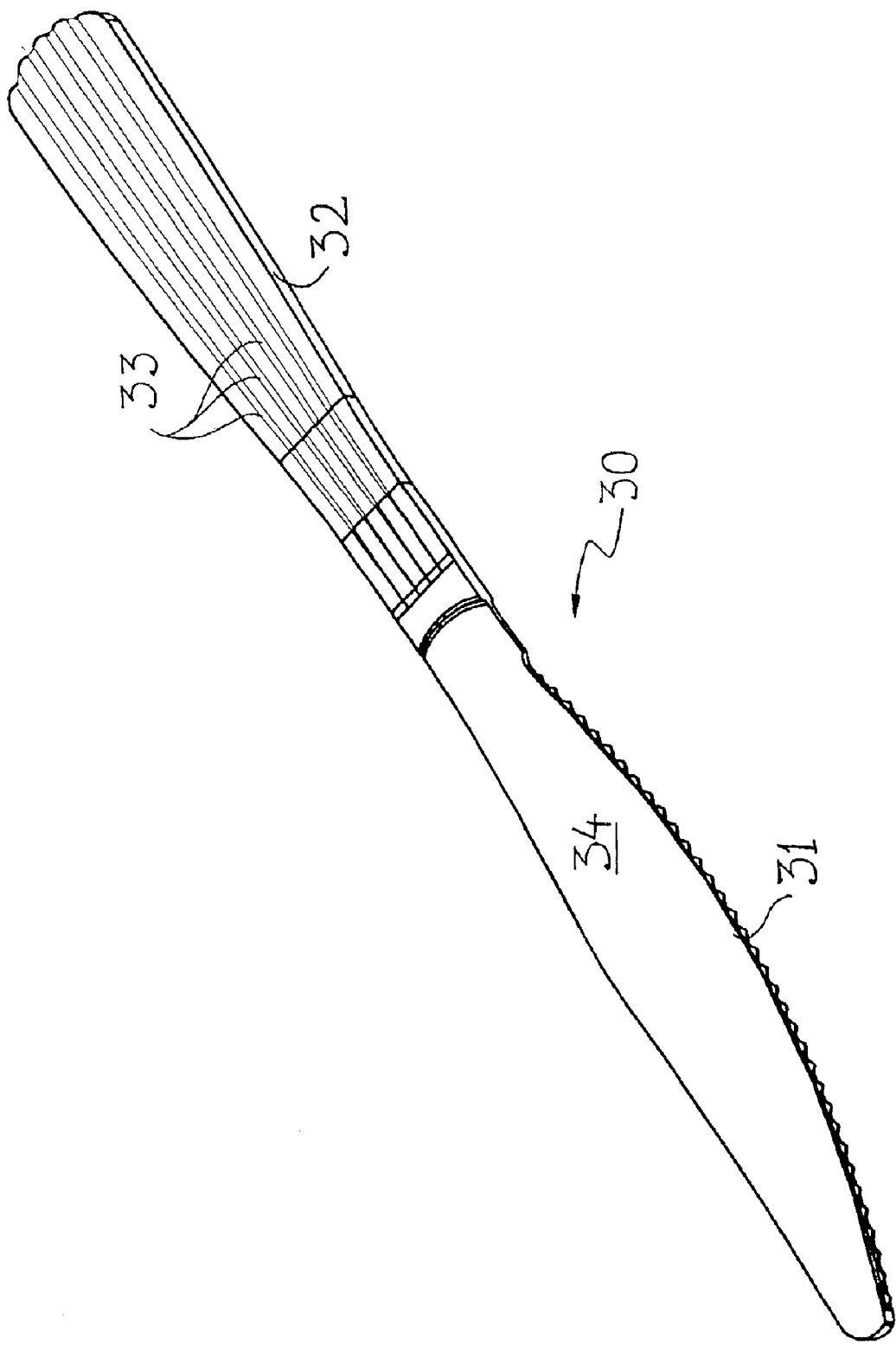
FIG. 3A is an isometric view of a knife with metallic coating in accordance with the invention.
Figure 3B:
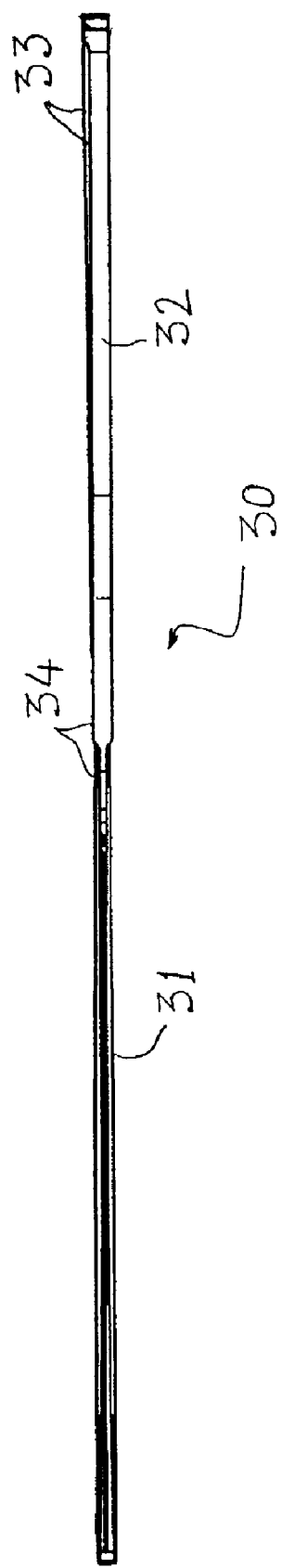
FIG. 3B is a side profile view of a knife with metallic coating in accordance with the invention.

FIGS. 3A and 3B respectively show isometric and side views of a knife represented by reference numeral 30 having its general construction in accordance with the present invention. Knife 30 has a blade portion 31 and a handle portion 32. Knife 30 also contains surface features in the form of flutes or other artistic contours generally denoted by reference numeral 33. A surface-coating layer of metal is deposited on at least one of the surfaces of the plastic knife to impart the appearance of a metallic cutlery piece. In the most preferred embodiment of the invention the metallic coating is applied to only one of the sides of the knife. The metallic coating on the plastic surface of the knife is denoted by reference numeral 34.

Figure 4:
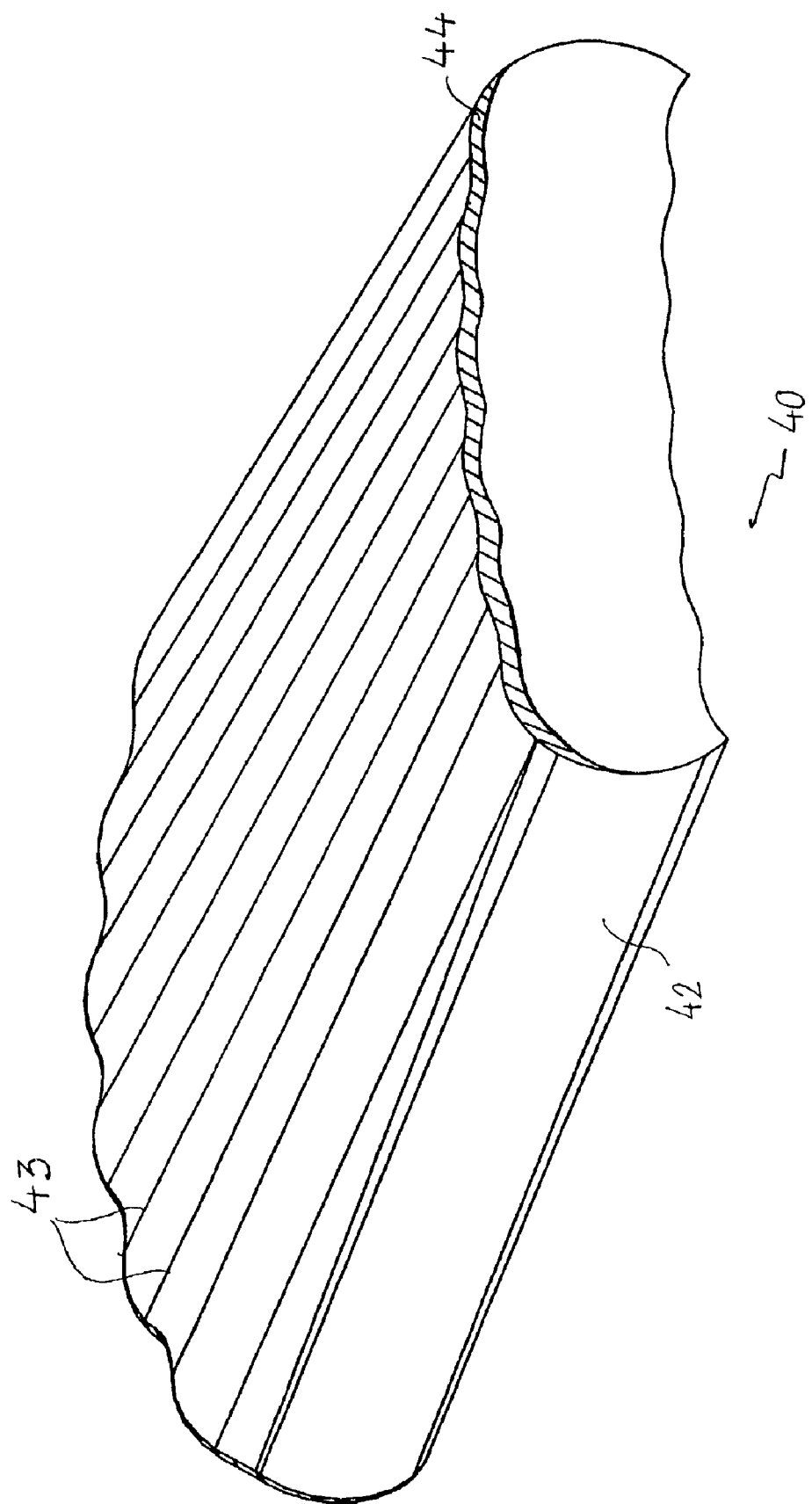
FIG. 4 is a cross-sectional view of a typical cutlery item exhibiting a metallic coating in accordance with the invention.

Referring now to FIG. 4 there is shown a rear cross-section of a typical cutlery item 40. The stem portion of the cutlery item 40 is denoted by reference numeral 42. In the described embodiment the stem 42 has various curved and flute-like features on its surface denoted by reference numeral 43. The cutlery item has a metallic coating applied on one of its surfaces shown in the cross-sectional view by reference numeral 44. The metallic coating 44 is very thin in relation to the bulk of the article (not shown to scale) and follows the contours on the surface of the part. The thickness of the metallic coating can vary depending upon the particular application, but for weight, cost and manufacturing time, a thin layer is preferred. For example, in a preferred embodiment, the thickness is approximately 200 nanometers or less. Various patterns and ornamental characteristics can adorn the stem, that are known to those in the art, and the present invention is applicable to any such designs.

The cutlery items in FIG. 1A through FIG. 3A have been shown as having particular configurations and specific design feature ratios, e.g. fork-tine length to overall fork length, spoon bowl length to overall spoon length, and knife blade length to overall knife length. It will be readily understood by those skilled in the art that these cutlery items are manufactured and marketed in a variety of geometrical configurations, feature ratios and sizes. The physical configurations and design features and aspect ratios exhibited here are done for the purpose of illustration and not by way of limitation.

Also, it should be readily apparent that depositing the metal layer on only one side of the article offers several economic advantages in comparison to coating the entire article. Firstly, there is a metallic material savings, as approximately only one-half of the surface area of the parts is metallized. Secondly, there is only one pass through the metallizer, and the parts are not subjected to the deposition mechanism twice to accommodate both sides. Thirdly, metallizing cycle-time is halved as it takes approximately half as long to deposit the metal on only one side of the parts. Finally, the process provides a simpler part handling, as the complex part handling mechanisms for turning/flipping the parts for metallizing both sides are avoided.

From an aesthetic standpoint the metallized coating is applied to the side which typically faces up in a traditional table-setting for placing cutlery implements. A traditional place setting typically includes a fork with tine facing upwards, a spoon with the concave bowl facing upwards and a knife with the serrated edge placed pointing left and away from the user; handle portions of all eating implements are towards the user.

Metal coating on the cutlery items can be applied by any of the known vacuum deposition procedures. Vacuum metallization or deposition is the deposition of a film or coating in a vacuum or low-pressure plasma environment. The term plasma generally refers to an ion- or electron-rich gaseous environment for providing appreciable electrical conductivity. Vacuum deposition is a term that is applied to processes that deposit atoms or molecules one at a time, such as in physical vapor deposition (PVD) or low-pressure chemical vapor deposition (LPCVD).

Typical PVD techniques can be used for accomplishing the objectives of the current invention. In Physical vapor deposition or (PVD) processes metallic particles are vaporized from a solid or liquid source and transported as vapor through vacuum or low-pressure gaseous or plasma environment. The vaporized material can be an element, alloy or compound. The condensation of the particles produces a thin-metallic coating or film on the substrate surface and imparts a metallic look to the substrate. Film thickness ranges from few nanometers to thousands of nanometers. However, PVD processes can be used to form thick deposits through multilayer coatings. Various variants of the PVD processes have been described in the prior art including Vacuum Evaporation, Sputter Deposition or Sputtering, Arc Vapor Deposition and Ion Plating. Additional Evaporation techniques include Filament Evaporation, Flash Evaporation, and Electron-beam Evaporation.

In order to ensure that durable metal coatings are deposited on the surface of the cutlery article the resin used must be of high quality and free of volatiles. Processing aids that are routinely added to commercial resins such as mineral oil and surface waxes are exuded to the surface of the part and interfere with obtaining adequate adhesion between the deposited metal and the part surface.

In the preferred embodiment of the present invention:
(a) The cutlery items are made of a light-transmitting grade of a thermoplastic polymeric material. The resin is substantially free of mineral oil and other volatile additives.
(b) The metallic coating is of the same composition as the stainless steel alloy used in real tableware cutlery.
(c) The metallic coating thickness is less than 200 nanometers.
(d) The metallic coating is applied on one side only of the cutlery articles.
(e) The metallic coating is applied by physical vapor deposition techniques.

In the most preferred embodiment of the present invention the metallic coating is applied to the plastic cutlery items by sputtering vacuum deposition (also referred to as sputter deposition or sputtering).

Sputtering is a PVD coating process which, is conducted in an evacuable coating or sputtering chamber. The source of the coating material, the target, is mounted opposite to the substrate items in the sputtering chamber which is then evacuated, generally in the range of 1 to 100 milliTorr (1 Torr=1 mm Hg) in the presence of an inert gas such as Argon. A negative DC or RF voltage is applied to the metal sputtering target (metal source), which is positioned inside the sputtering or coating chamber. A gas plasma or glow discharge is created between the metal target and the item or substrate to be coated. Positively charged gas ions generated in the plasma region are propelled at high velocities towards the target (negative potential), resulting in the ejection of neutral atomic size particles of the metal target. Thus, Sputtering is a non-thermal vaporization process where surface atoms are physically ejected from the metal source or target by momentum transfer or exchange from an energetic bombarding particle or gaseous ion accelerated from plasma. A particular advantage of the sputtering technique is the ability for depositing metals as well as metal alloys and is well suited for depositing stainless steel alloy compositions used in traditional metal cutlery.

A useful method of manufacture of metallized plastic cutlery and other tableware according to the present invention is as follows:

Step 1: Molding plastic cutlery using traditional injection molding techniques well known in the art.

Step 2: Taking out the plastic cutlery from the mold using a part take-out device such as a side-entry or top-entry robot, again, well known in the art and in current use at the current assignee's facility.

Step 3: Placing the individual pieces of cutlery in a non-contiguous manner on transferring or conveying means wherefrom cutlery parts are transferred to a vacuum depositing station. Cutlery pieces are maintained in an individualized or non-contiguous manner to prevent surface masking by adjacent cutlery pieces during metallizing or coating.

Step 4: Subjecting plastic cutlery to a vacuum deposition process.

Step 5: Collecting plastic cutlery that has been metallized and packing them into suitable packaging containers for shipping.

In testing of the preferred embodiment, plastic cutlery pieces in the form of a fork, spoon and knife were introduced into a lab-size sputtering chamber. The sputtering equipment was provided by Soleras, Inc. A stainless steel target was mounted in the sputtering chamber. The particular composition of stainless steel was 304. The chamber was then pumped down until a vacuum was reached in the range around $10^{-3}$ mm Hg. Argon was supplied to the chamber to generate the plasma. When the vacuum was reached a negative voltage in the range of 5 to 10 kW was applied to the cathode. The coating operation at this setting was continued for about 1 to 5 seconds. Following coating, the power was turned off and vacuum was then released allowing the chamber to rise to atmospheric pressure. Thereafter parts were removed from the chamber and examined. Various tests were conducted on the plastic cutlery items for peel-off adhesion. In some trials, coating was applied to both sides of a part. In other iterations it was applied to only one side of the part.

It was found that polystyrene cutlery exhibits much better coating adhesion compared to polypropylene cutlery. A power setting of 7.5 kW and a 3-second sputtering time, were deemed to be the optimum conditions for good adhesion, surface appearance and uniformity of coating. The most remarkable finding from this experimental work was that the coating could be applied to one side of the clear polystyrene part to obtain the desired metallic look or effect. This unexpected result reduces manufacturing time and the complexity of manufacturing while at the same time providing twice the utilization of the metal target.

For a given hardware and power setting configuration, the metal deposition or the thickness of the metal layer is proportional to the duration of sputtering. An increase in the duration of sputtering (sputter time) results in a corresponding increase in the metal-layer thickness. Increase in metal layer thickness is directly proportional to the optical density; hence optical density measurements can be used to define the thickness of the metal deposited on the surface. Optical density values of around 1.5 are considered acceptable for the purpose of metallized cutlery. At optical density values of 1 and under the metal layer tends to be very thin and lacking adequate opacity for imparting an attractive metallic appearance on the part surface. Increase in optical density can be attained by increased metal deposition or longer sputter time. Another method of enhancing optical density without increasing sputter time is to incorporate a light transmitting dye or tint in the base material. Typically gray tints work well but tints in a variety of colors can be utilized for enhancing the opacity of the cutlery item and imparting other appearance effects.

Tape peel tests are normally used for testing the adhesion between the cutlery item surface and the metal layer deposited thereon. Adhesion is also related to abrasion resistance or durability of the coating. Adhesion and abrasion resistance of the deposited metal layer to the substrate surface can be enhanced by a variety of methods.

One method of improving abrasion resistance involves coating the cutlery item with a light transmitting heat- or UV-curable coating, which serves to seal-off the deposited metal layer. Such coating compositions are well known in the art and are used to provide a barrier overcoat over a variety of articles including Compact disks and DVDs. FDA approved compositions of hardenable clear coatings, which can be applied by spraying, are also readily available for covering food service articles.

Another way to improve resistance to abrasion is subjecting the cutlery item to a flame or Corona treatment for increasing the surface energy of the cutlery item. Surface treatments for enhancing the surface energy of plastic parts are also well known in the art. A typical corona treatment can enhance the surface energy of a polystyrene part from 35 dynes to about 46 dynes.

The adhesion between the substrate or the plastic article and the deposited metal layer can be enhanced by utilizing a volatiles free resin completely free of mineral oil and similar lubricants.

Another technique to improve adhesion of the metallic coating to the article is by utilizing a mixture of Argon and Nitrogen for plasma generation in the sputtering chamber during metal deposition. The typical concentration of Nitrogen in the Nitrogen and Argon mixture is between 10% and 40%. Sputter deposition conducted with a mixture of Nitrogen and Argon yields a metal layer with enhanced durability compared to Argon plasma alone.

To determine that the coated cutlery could be used against various foods, which could affect the coating or cause it to peel-off, the cutlery was subjected to confirmatory tests in a variety of food environments. Tests included subjecting cutlery to boiling water, boiling tomato sauce, boiling water-vinegar mixture, lemon juice, coffee, ice, thermal cycles with alternate exposure to boiling water and ice-cold water, shipping bulk cutlery across the country etc. It must be noted that the coated cutlery is susceptible to scratches due to abrasion as any ordinary metal cutlery.

Although, this invention has been described particularly in relation to metallizing plastic cutlery, it will be recognized that it is applicable to general food service items, tableware and other industries wherein it is desired to impart metallic coating onto plastic and non-plastic parts. Also, it would be realized by those skilled in the art that various modifications, alterations and adaptations can be made to this invention without departing from the spirit and scope of this invention.

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. A metallized plastic food service item, comprising:
a plastic tableware article having a display surface and an underside, said plastic tableware article being adapted for placement on a table surface in a traditional table-setting presentation with said underside facing down towards said table surface and said display surface facing upwards; and
a thin metallic coating deposited on said plastic tableware article, wherein said thin metallic coating is of a sufficient thickness to impart a reflective metal-like appearance to the plastic tableware article, said thickness being less than about 2000 nanometers and wherein said thin metallic coating is deposited by a vacuum deposition process.

2. The metallized plastic food service item according to claim 1, wherein said thin metallic coating is at least one metal selected from the group consisting of: silver, steel, stainless steel, chromium, aluminum, copper and gold.

3. The metallized plastic food service item according to claim 1, wherein said thin metallic coating is less than 1000 nanometers in thickness.

4. The metallized plastic food service item according to claim 1, further comprising a thin overcoat of a curable clear coating on said thin metallic coating.

5. The metallized plastic food service item according to claim 1, wherein said plastic tableware article is an implement for handling and consuming food, selected from a group consisting of fork, knife, and spoon.

6. The metallized plastic food service item according to claim 1, wherein said plastic tableware article is composed of a light transmitting plastic material.

7. The metallized plastic food service item according to claim 1, wherein said plastic tableware article is composed of polystyrene.

8. The metallized plastic food service item according to claim 1, wherein said plastic tableware article is obtained from a plastic resin composition which is substantially free of mineral oil and wax.

9. The metallized plastic food service item according to claim 1, wherein said metallized plastic food service item has an optical density of less than 2.0.

10. The metallized plastic food service item according to claim 1, wherein said plastic tableware article is produced by injection molding.

11. The metallized plastic food service item according to claim 1, further comprising cosmetic surface features for enhancing the reflective metal-like appearance of said plastic tableware article.

12. The metallized plastic food service item according to claim 1, wherein said vacuum deposition process is a sputtering deposition process.

13. A metallized plastic food service item, comprising:
a plastic tableware article having a display surface and an underside, said plastic tableware article being adapted for placement on a table surface in a traditional table-setting presentation with said underside facing down towards said table surface and said display surface facing upwards; and
a thin metallic coating deposited on the display surface of said plastic tableware article, wherein said thin metallic coating is of a sufficient thickness to impart a reflective metal-like appearance to the plastic tableware article, said thickness being less than thousands of nanometers and wherein said thin metallic coating is deposited by a vacuum deposition process.

14. The metallized plastic food service item according to claim 13, wherein said thin metallic coating is at least one metal selected from the group consisting of: silver, steel, stainless steel, chromium, aluminum, copper and gold.

15. The metallized plastic food service item according to claim 13, wherein said thin metallic coating is less than 1000 nanometers in thickness.

16. The metallized plastic food service item according to claim 13, further comprising a thin overcoat of a curable clear coating on said thin metallic coating.

17. The metallized plastic food service item according to claim 13, wherein said plastic tableware article is an implement for handling and consuming food, selected from a group consisting of fork, knife and spoon.

18. The metallized plastic food service item according to claim 13, wherein said plastic tableware article is composed of a light transmitting plastic material.

19. The metallized plastic food service item according to claim 13, wherein said plastic tableware article is composed of polystyrene.

20. The metallized plastic food service item according to claim 13, wherein said metallized plastic food service item has an optical density of less than 2.0.

21. The metallized plastic food service item according to claim 13, wherein said plastic tableware article is produced by injection molding.

22. The metallized plastic food service item according to claim 13, wherein said plastic tableware article is obtained from a plastic resin composition which is substantially free of mineral oil and wax.

23. The metallized plastic food service item according to claim 13, further comprising cosmetic surface features for enhancing the reflective metal-like appearance of said plastic tableware article.

24. The metallized plastic food service item according to claim 13, wherein said vacuum deposition process is a sputtering deposition process.

25. A tableware article for handling and consuming food, comprising a light transmitting plastic material and having a plurality of surfaces, wherein at least one surface amongst said plurality of surfaces is cosmetically accentuated by a thin metal layer; said thin metal layer being deposited by a sputter deposition process, whereby a reflective metal-like appearance is imparted to at least a portion of said tableware article, and said layer of said portion being less than about 2000 nanometers.

26. A metallized plastic food service article produced by the process comprising the steps of:
   molding a plastic tableware article by the process of injection molding, wherein said plastic tableware article has a first surface and a second surface;
   placing said plastic tableware article into a vacuum metallizing unit with said first surface facing said vacuum metallizing unit; and
   depositing onto said first surface of the plastic tableware article, a thin metallic coating, by a vacuum deposition process, of sufficient thickness to impart a reflective metal-like appearance to the plastic tableware article, wherein said thickness being less than thousands of nanometers.

27. The metallized plastic food service article produced by the process according to claim 26, further comprising the steps of spraying a clear coating and curing said clear coating.

28. The metallized plastic food service article produced by the process according to claim 26, wherein said vacuum deposition process is a physical vapor deposition.

29. The metallized plastic food service article produced by the process according to claim 28, wherein said physical vapor deposition is a sputtering vapor deposition.

30. The metallized plastic food service article produced by the process according to claim 29, wherein said sputtering deposition process utilizes plasma generated by mixtures of Argon and Nitrogen.

31. The metallized plastic food service article produced by the process according to claim 26, wherein said thin metallic coating is at least one metal chosen from the group of metals consisting of silver, steel, stainless steel, chromium, aluminum, copper and gold.

32. The metallized plastic food service article produced by the process according to claim 26, wherein said plastic tableware article is molded from a light transmitting plastic material with a color tint.

33. The metallized plastic food service article produced by the process according to claim 26, wherein said thin metallic coating is less than 1000 nanometers in thickness.

34. The metallized plastic food service item according to claim 1, wherein said thin metallic coating is less than about 500 nanometers in thickness.

35. The metallized plastic food service item according to claim 1, wherein said thin metallic coating is less than about 200 nanometers in thickness.

36. The metallized plastic food service item according to claim 13, wherein said thin metallic coating is less than about 500 nanometers in thickness.

37. The metallized plastic food service item according to claim 13, wherein said thin metallic coating is less than about 200 nanometers in thickness.

* * * * *

UNITED STATES PATENT AND TRADEMARK OFFICE
CERTIFICATE OF CORRECTION

PATENT NO. : 6,983,542 C1
APPLICATION NO. : 90/008337
DATED : September 22, 2009
INVENTOR(S) : Ashish K. Mithal et al.

It is certified that error appears in the above-identified patent and that said Letters Patent is hereby corrected as shown below:

Title page,
Item (73), delete "GE Canada Finance Holding Company, Norwalk, CT (US)", insert --Waddington North America, Inc., Chelmsford, MA (US)--

Signed and Sealed this

Tenth Day of November, 2009

David J. Kappos
*Director of the United States Patent and Trademark Office*

EX PARTE REEXAMINATION CERTIFICATE (7079th)
United States Patent
Mithal et al.

(10) Number: US 6,983,542 C1
(45) Certificate Issued: Sep. 22, 2009

(54) METALLIZED CUTLERY AND TABLEWARE

(75) Inventors: Ashish K. Mithal, North Chelmsford, MA (US); David Gordon, Groton, MA (US); Raymond Chan, Framingham, MA (US); Thomas E. Ellsworth, Wilmington, MA (US); William A. Gallop, Westminster, MA (US)

(73) Assignee: GE Canada Finance Holding Company, Norwalk, CT (US)

Reexamination Request:
No. 90/008,337, Nov. 22, 2006

Reexamination Certificate for:
Patent No.: 6,983,542
Issued: Jan. 10, 2006
Appl. No.: 10/228,147
Filed: Aug. 26, 2002

Related U.S. Application Data

(60) Provisional application No. 60/314,677, filed on Aug. 24, 2001.

(51) Int. Cl.
*A47J 43/28* (2006.01)

(52) U.S. Cl. .................. 30/322; 30/324; 30/340
(58) Field of Classification Search .......... None
See application file for complete search history.

(56) References Cited

U.S. PATENT DOCUMENTS

| | | | |
|---|---|---|---|
| 1,197,256 A | 9/1916 | Brearley | |
| 3,136,416 A | 6/1964 | Goldrosen | |
| 3,445,350 A | 5/1969 | Klinger et al. | |
| 3,607,350 A | 9/1971 | Rathsack | 427/306 |
| 3,629,922 A | 12/1971 | Miller et al. | 428/626 |
| 3,896,252 A | 7/1975 | Tuttle | 427/306 |
| 3,926,792 A | 12/1975 | Buford | 209/636 |
| 3,962,494 A | 6/1976 | Nuzzi | 427/304 |
| 4,009,995 A | 3/1977 | Dressler | 8/516 |
| 4,039,714 A | 8/1977 | Roubal et al. | 428/336 |
| 4,073,743 A | 2/1978 | Midler, Jr. et al. | 424/209.1 |
| 4,195,117 A | 3/1980 | Luch | 428/626 |
| 4,362,253 A | 12/1982 | Wortley et al. | 220/276 |
| 4,367,138 A | 1/1983 | Kustas | 209/224 |
| 4,461,895 A | 7/1984 | Fritschi et al. | 546/75 |
| 4,610,895 A | 9/1986 | Tubergen et al. | 427/99.1 |
| 4,632,253 A | 12/1986 | Stromgren et al. | 209/570 |
| 4,803,094 A | 2/1989 | Myers | |
| 4,810,333 A | 3/1989 | Gulla et al. | 205/125 |
| 4,825,025 A | 4/1989 | Seiferth | |
| 5,022,554 A | 6/1991 | Heeter et al. | |
| 5,177,124 A | 1/1993 | Questel et al. | 523/219 |
| 5,280,052 A | 1/1994 | Questel et al. | 523/219 |
| 5,378,735 A * | 1/1995 | Hosokawa et al. | 522/79 |
| 5,782,346 A | 7/1998 | Gray et al. | 206/228 |
| 6,074,740 A | 6/2000 | Scheckenbach et al. | |
| 6,145,204 A | 11/2000 | Cash | 30/322 |
| 6,524,694 B1 * | 2/2003 | Phillips | 428/323 |
| 6,676,810 B2 | 1/2004 | Parent | |
| 2003/0031891 A1 | 2/2003 | Fields | 428/626 |

FOREIGN PATENT DOCUMENTS

| | | |
|---|---|---|
| CN | 2119126 U | 10/1992 |
| JP | 57-005870 | 1/1982 |

OTHER PUBLICATIONS http://www.merriam-webster.com/dictionary/metallized.*

(Continued)

*Primary Examiner*—Cary E. O'Connor

(57) ABSTRACT

A plastic cutlery item, fabricated primarily from a plastic material, such as polystyrene, having a metallic coating that imparts to this cutlery item the appearance of metal cutlery or silverware. The plastic cutlery or tableware items are molded using traditional injection molding techniques, and subjected to a vacuum metallizing process in an individualized non-contiguous manner, where a thin metallic layer is deposited on at least one of their surfaces. The resultant items simulate the appearance of solid metal cutlery or tableware. In the most preferred embodiment of the invention the plastic cutlery or tableware items are molded from a light-transmitting grade of Polystyrene resin and are coated with a thin stainless steel layer through vacuum sputtering deposition on only one of the surfaces.

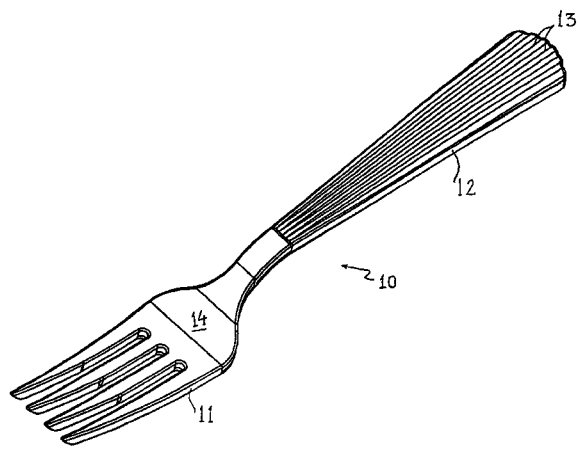

OTHER PUBLICATIONS

Hilestad, K., Decorating and Printing, Modern Plastics Encylopedia, pp. F–7–F–8, 1999.

PCT International Search Report dated Dec. 19, 2002 of International Application No. PCT/US02/27232 filed Aug. 26, 2002.

European Search Report dated Aug. 17, 2004 of European Patent Application No. EP 02 76 3539.0 filed Aug. 26, 2002.

Document entitled "Search Report No. 07–348".

Document entitled "Notarization No. 19726–2007" with attachments and translation.

Muccio, E., "Decoration and Assembly of Plastic Parts", pp. iv–ix and Chapter 7 and Chinese translation thereof, 1999.

"Simply Cookware," Cookware Materials—Properties, Care & Use, http://www.simplycookware.com/cookware–materials.html, Nov. 5, 2007.

Kirkland, Carl, "Sputtered single–use silverware," http://www.immnet.com/articles?article=2907, Sep. 24, 2007.

Vacuum Coating Technology and the growth of the Society of Vacuum Coaters, copyright 2007 Society of Vacuum Coaters, Donald M. Mattox and Vivienne Harwood Mattox, eds.; Chapter 2, "Decorative Coating," by Donald M. Mattox; Chapter 5, "Vacuum Coating Technology and Optical Storage Media," by John Marcantonio.

Statement from Spirit Brands, Jul. 28, 2006, 2 pages.

Statement from Providence Metallizing, Jun. 27, 2006, 3 pages.

Statement from Automated Vacuum Systems, Aug. 8, 2006, 2 pages.

"The Classy Collection is a Standout", Spir–it, Inc./ Oak Hill, Wakefield MA, not later than 1999–2000.

"Introducing the Classy Collection", Spir–it, Inc., Wakefield MA, not later than 1997–2000.

* cited by examiner

US 6,983,542 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 18, 26–31 and 33 are cancelled.

Claims 1, 2, 5–8, 10, 11, 13, 14, 17, 19, 21–23, 25 and 32 are determined to be patentable as amended.

Claims 3, 4, 9, 12, 15, 16, 20, 24 and 34–37, dependent on an amended claim, are determined to be patentable.

New claims 38–48 are added and determined to be patentable.

1. A metallized plastic food service item, comprising:
a plastic [tableware] *cutlery* article having a display surface and an underside, said plastic [tableware] *cutlery* article being adapted for placement on a table surface in a traditional table-setting presentation with said underside facing down towards said table surface and said display surface facing upwards; and
a thin metallic coating deposited on said *display surface of said* plastic [tableware] *cutlery* article, wherein said thin metallic coating *is characterized by its suitability for food contact without an overcoat, and is at least one of steel and stainless steel, and wherein said thin metallic coating* is of a sufficient thickness to impart a reflective metal-like appearance to the plastic [tableware] *cutlery* article, *to simulate genuine metal cutlery,* said thickness being less than about 2000 nanometers and wherein said thin metallic coating is deposited by a vacuum deposition process.

2. The metallized plastic food service item according to claim 1, wherein said thin metallic coating is [at least one metal selected from the group consisting of: silver, steel,] stainless steel [, chromium, aluminum, copper and gold].

5. The metallized plastic food service item according to claim 1, wherein said plastic [tableware] *cutlery* article is [an implement for handling and consuming food,] selected from a group consisting of fork, knife, and spoon.

6. The metallized plastic food service item according to claim 1, wherein said plastic [tableware] *cutlery* article is composed of a light transmitting plastic material.

7. The metallized plastic food service item according to claim 1, wherein said plastic [tableware] *cutlery* article is composed of polystyrene.

8. The metallized plastic food service item according to claim 1, wherein said plastic [tableware] *cutlery* article is obtained from a plastic resin composition which is substantially free of mineral oil and wax.

10. The metallized plastic food service item according to claim 1, wherein said plastic [tableware] *cutlery* article is produced by injection molding.

11. The metallized plastic food service item according to claim 1, further comprising cosmetic surface features for enhancing the reflective metal-like appearance of said plastic [tableware] *cutlery* article.

13. A metallized plastic food service item, comprising:
a plastic [tableware] *cutlery* article having a display surface and an underside, said plastic tableware article being adapted for placement on a table surface in a traditional table-setting presentation with said underside facing down towards said table surface and said display surface facing upwards; and
a thin metallic coating deposited on the display surface of said plastic [tableware] *cutlery* article, wherein said thin metallic coating is of a sufficient thickness to impart a reflective metal-like appearance to the plastic [tableware] *cutlery* article, said thickness being less than [thousands of] *about 2000* nanometers and wherein said thin metallic coating is deposited by a vacuum deposition process*; and*

*wherein at least a portion of said underside is characterized by absence of said thin metallic coating, said plastic cutlery article being composed of a light transmitting plastic material.*

14. The metallized plastic food service item according to claim 13, wherein said thin metallic coating is at least one metal selected from the group consisting of: [silver,] steel[,] *and* stainless steel[, chromium, aluminum, copper and gold].

17. The metallized plastic food service item according to claim 13, wherein said plastic [tableware article is an implement for handling and consuming food,] *cutlery article is* selected from a group consisting of fork, knife and spoon.

19. The metallized plastic food service item according to claim 13, wherein said plastic [tableware] *cutlery* article is composed of polystyrene.

21. The metallized plastic food service item according to claim 13, wherein said plastic [tableware] *cutlery* article is produced by injection molding.

22. The metallized plastic food service item according to claim 13, wherein said plastic [tableware] *cutlery* article is obtained from a plastic resin composition which is substantially free of mineral oil and wax.

23. The metallized plastic food service item according to claim 13, further comprising cosmetic surface features for enhancing the reflective metal-like appearance of said plastic [tableware] *cutlery* article.

25. A [tableware] *cutlery* article for handling and consuming food, comprising a light transmitting plastic material and having a plurality of surfaces, wherein at least one surface amongst said plurality of surfaces is [cosmetically accentuated by] *deposited with* a thin metal layer[;] *suitable for food contact without an overcoat;* said thin metal layer being deposited by a sputter deposition process, whereby a reflective metal-like appearance is imparted to at least a portion of said [tableware] *cutlery* article, and said *thin metal* layer [of said portion] being less than about 2000 nanometers.

32. The metallized plastic food service article produced by the process according to claim [26] *13*, wherein said plastic [tableware] *cutlery* article is molded from a light transmitting plastic material with a color tint.

*38. A metallized plastic food service item, comprising:*
*a plastic cutlery article having a display surface and an underside, said plastic cutlery article being adapted for placement on a table surface in a traditional table-setting presentation with said underside facing down towards said table surface and said display surface facing upwards; and*
*a thin metallic coating selected from the group consisting of steel and stainless steel deposited on at least a por-* tion of said plastic cutlery article without an overcoat, wherein said thin metallic coating is of a sufficient thickness to impart a reflective metal-like appearance to the plastic cutlery article, said thickness being less than 2000 nanometers and wherein said thin metallic coating is deposited by a vacuum deposition process.

39. The metallized plastic food service item according to claim 38, wherein said thin metallic coating is stainless steel.

40. A metallized plastic food service item as claimed in claim 38, wherein said plastic cutlery article is injection molded primarily from a polystyrene polymer.

41. The metallized plastic food service item according to claim 40, wherein said thin metallic coating is stainless steel.

42. The metallized plastic food service item according to claim 38, wherein said plastic cutlery article is selected from a group consisting of a fork, knife and spoon.

43. A metallized food service item, comprising:

a plastic cutlery article having a display surface and an underside, said plastic cutlery article being adapted for placement on a table surface with said underside facing down towards said table surface and said display surface facing upwards; and a thin metallic coating deposited on at least a portion of said plastic cutlery article by a vacuum deposition process, wherein said thin metallic coating is of a sufficient thickness to impart a reflective metal-like appearance to the plastic cutlery article, said thickness being less than about 2000 nanometers; and wherein said thin metallic coating comprises at least one of steel and stainless steel.

44. The metallized food service item according to claim 43, wherein approximately all of said plastic cutlery is coated with said thin metallic coating.

45. A metallized food service item, comprising:

a plastic cutlery article having a display surface and an underside, said plastic cutlery article being adapted for placement on a table surface in a traditional table-setting presentation with said underside facing down towards said table surface and said display surface facing upwards; and a thin metallic coating deposited on at least a portion of said plastic cutlery article by a vacuum deposition process, wherein said thin metallic coating is of a sufficient thickness to impart a reflective metal-like appearance to the plastic cutlery article, said thickness being less than about 2000 nanometers and wherein said thin metallic coating is stainless steel.

46. The metallized food service item according to claim 45, wherein said thin metallic coating is deposited on only a portion of said plastic cutlery article.

47. The metallized plastic food service item according to claim 45, wherein said plastic cutlery article is at least one of a fork, a knife and a spoon.

48. The metallized plastic food service item according to claim 38, wherein said thin metallic coating is deposited on said display surface, at least a portion of said underside of said plastic cutlery article is characterized by absence of said thin metallic coating.

\* \* \* \* \*